United States Patent
Cachier et al.

(10) Patent No.: US 6,529,105 B1
(45) Date of Patent: Mar. 4, 2003

(54) PROCESS AND DEVICE FOR BONDING TWO MILLIMETER ELEMENTS

(75) Inventors: Gerard Cachier, Bures sur Yvette (FR); Jean-Yves Daden, Bois Colombes (FR); Alain Grancher, Vemars (FR)

(73) Assignee: Thomson-CFS, Paris (FR)

( * ) Notice: Subject to any disclaimer, the term of this patent is extended or adjusted under 35 U.S.C. 154(b) by 0 days.

(21) Appl. No.: 09/494,358

(22) Filed: Jan. 31, 2000

(51) Int. Cl.$^7$ ................................................ H01P 3/08
(52) U.S. Cl. ........................................ 333/238; 333/246
(58) Field of Search ................................. 333/238, 246

(56) References Cited

U.S. PATENT DOCUMENTS

| | | | | |
|---|---|---|---|---|
| 3,998,669 A | * | 12/1976 | Strnat | 148/103 |
| 4,383,270 A | * | 5/1983 | Schelhorn | 257/675 |
| 4,394,707 A | * | 7/1983 | Consoli | 361/736 |
| 4,816,789 A | | 3/1989 | Mars | 333/246 |
| 4,835,500 A | * | 5/1989 | Sequeira | 333/258 |
| 5,469,130 A | | 11/1995 | Okada et al. | 333/246 |
| 5,777,528 A | * | 7/1998 | Schumacher et al. | 333/33 |
| 6,188,358 B1 | * | 2/2001 | Clynne | 343/700 R |
| 6,215,377 B1 | * | 4/2001 | Douriet | 333/247 |

FOREIGN PATENT DOCUMENTS

| | | |
|---|---|---|
| EP | 0 747 997 | 12/1996 |
| GB | 2 193 848 A | 2/1988 |
| WO | WO 98/53518 | 11/1998 |

OTHER PUBLICATIONS

Patent Abstracts of Japan, vol. 12, No. 217 (E–624). Jun. 21, 1988 & JP 63 013401 A (Mitsubishi Electric Corp), Jan. 20, 1988 See Abstract.
Nelson S. et al.: "Optimum Microstrip Interconnects" MTT–S International Microwave Symposium Digest, Boston, Jun. 10–14, 1991, vol. 3, Jun. 10, 1991, pp. 1071–1074, XP000260308, Heiter, G.L., See Figures 1, 7.

* cited by examiner

Primary Examiner—Benny Lee
Assistant Examiner—Kimberly E Glenn
(74) Attorney, Agent, or Firm—Oblon, Spivak, McClelland, Maier & Neustadt, P.C.

(57) ABSTRACT

A device, and a method for making the same, for bonding two millimeter elements, which include a substrate having an upper face and a lower face, a conducting line on the upper face and oriented substantially perpendicular to an edge of the substrate, and two continuous bounding zones on the upper face and along the edge of the substrate, each continuous bounding zone being electrically grounded, and having a length along said edge between about two and about five times the width of the conducting lines.

34 Claims, 6 Drawing Sheets

VIEW AA'

VIEW B

VIEW CC'

VIEW AA'

PROCESS AND DEVICE FOR BONDING TWO MILLIMETER ELEMENTS

BACKGROUND OF THE INVENTION

1. Field of the Invention

The present invention relates to a process and a device for bonding two millimeter elements. Millimeter elements operate at frequencies typically greater than 30 Ghz. In particular, the invention enables bonding two millimeter elements having microstrip conducting lines.

2. Discussion of the Background

Printed circuits, on which millimeter circuits are made, can have at least two types of propagation lines.

A first type is said to be coplanar because the printed circuit implements coplanar lines. A coplanar line consists of a conducting line surrounded by two ground planes situated symmetrically on either side of the conducting line, the conducting line and the ground planes being situated on the same face of the substrate of the printed circuit. The bonds between millimeter circuits are formed by wires. These bonds can introduce disturbances when the circuits to be bonded are too far apart. This is because an electric field spreads horizontally between the central conductor, connected to the conducting line, and the lateral conductors, situated on either side, connected to the ground planes. The characteristic impedance of this propagation line is determined mainly by the ratio between the width of the conductor and the width of the space between the central conductor and the lateral conductors, as well as by the dielectric constant of the support, namely air.

The second type is the so-called microstrip because the printed circuit implements microstrip lines. The printed circuit thus comprises a dielectric substrate with two main faces, an upper face and a lower face. A conductor having the shape of a strip is formed on the upper face and a ground conductor is made on the entirety of the lower face. In accordance with this arrangement an electric field spreads between the strip-like conductor and the ground conductor. When manufacturing a microwave-frequency device, various millimeter elements are arranged in a metal casing. The millimeter elements may consist of millimeter circuits formed on a printed circuit, of substrates or of components. Each millimeter element is attached to a bedplate screwed onto the metal casing. Under these conditions, ground continuity is achieved on the one hand by soldering or by conductive cementing to the entire surface of the printed circuit and on the other hand by screwing the bedplate to the metal package. In the millimeter frequency region, the ground continuity of the microwave-frequency device described above may not be of sufficient quality. In particular, when ground continuity is ensured by contact, between a package screwed onto the casing and the casing, for example, the latter may not be of good quality, if the screwing is insufficient or if the surfaces in contact are not perfectly plane. Moreover, when two millimeter circuits to be bonded are far apart, the techniques described above may not be useable.

SUMMARY OF THE INVENTION

An object of the invention is to alleviate the above drawbacks.

One embodiment of the device of the present invention is a millimeter element including:

a substrate having an upper face and a lower face;

a conducting line on the upper face and oriented substantially perpendicular to an edge of the substrate; and two continuous bounding zones on the upper face and along the edge of the substrate, each continuous bounding zone being electrically grounded, and having a length between about two and about five times the width of the conducting lines.

One embodiment of the method of present invention includes:

forming a first conducting line on an upper face of a first substrate and perpendicular to an edge of the first substrate;

forming a second conducting line on all upper face of a second substrate and perpendicular to an edge of the second substrate;

forming two continuous bounding zones on the upper face of the first millimeter element and along the edge of the first substrate, each continuous bounding zone being electrically grounded, and having a length between about two and about five times the width of the conducting lines;

forming two continuous bounding zones on the upper face of the second millimeter element and along the edge of the second substrate, each continuous bounding zone being electrically grounded, and having a length between about two and about five times the width of the conducting line;

connecting the conducting line of the first millimeter element to the conducting line of: the second millimeter element; and connecting the continuous bounding zones of the first millimeter element to the continuous bounding zones of the second millimeter element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
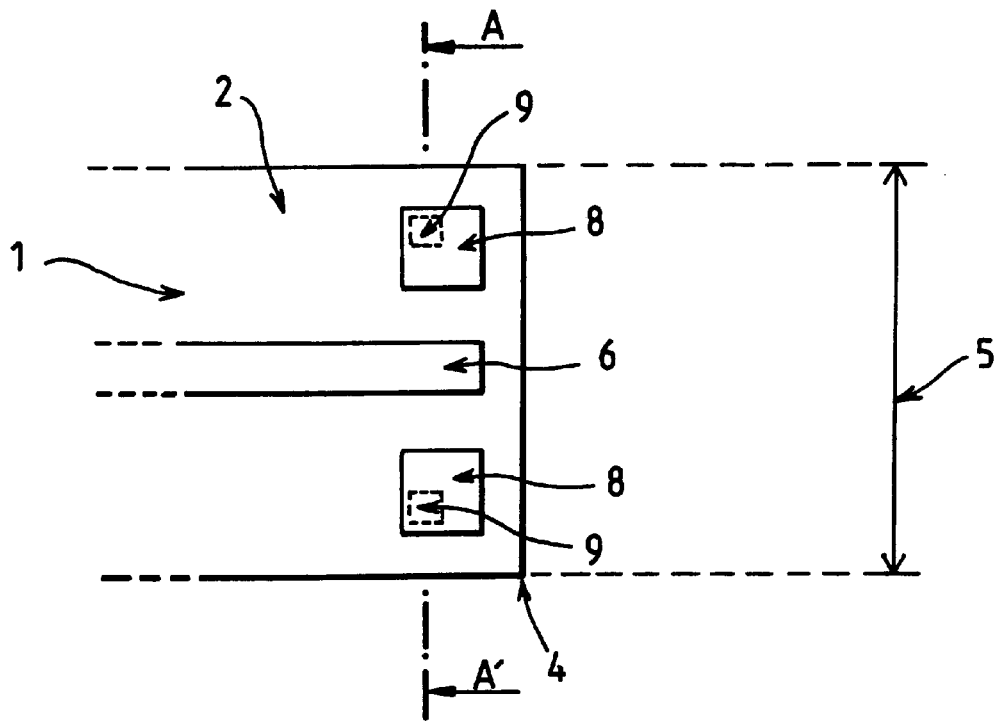
FIG. 1 is a block diagram of an end of a first millimeter element according to the present invention.
Figure 2:
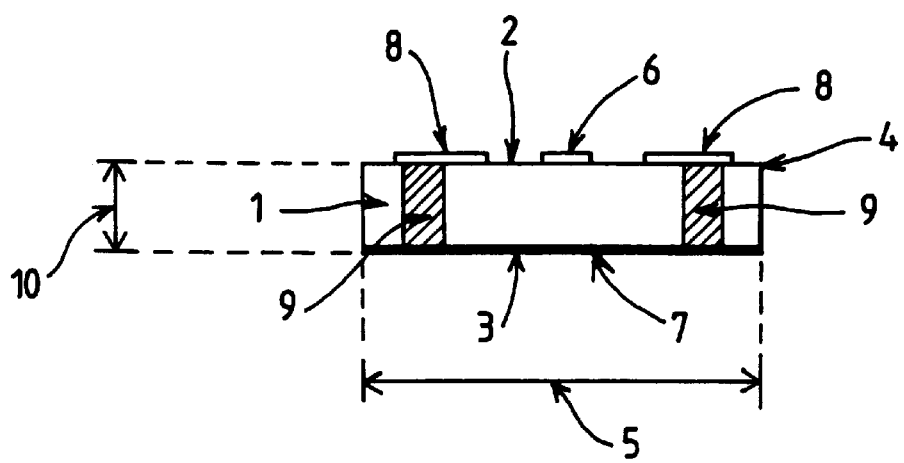
FIG. 2 is a sectional view of the millimeter element of FIG. 1.

Referring now to the drawings, wherein like reference numerals designate identical or corresponding parts throughout the several views, a first embodiment of the present invention in the form of an end of a millimeter element as shown in the block diagram of FIGS. 1–2 is described.

FIGS. 1 and 2 represent an end of a printed circuit of a millimeter circuit. FIG. 2 is a sectional view through the axis AA' of the printed circuit represented in FIG. 1. The printed circuit is made on a dielectric substrate 1 having an upper face 2 and a lower face 3. The represented end of the dielectric substrate 1 terminates in an edge 4 of determined length 5, of the order of 5 mm for example. Between at least a first and a second particular point, the millimeter circuit carries out a particular function, filtering, for example. To carry out this particular function, the millimeter circuit can comprise, for example, components, not represented, such as capacitors, resistors, amplifiers, soldered to the printed circuit. The millimeter circuit is used in the microwave frequency region, and within the framework of the invention, the frequencies implemented are preferably greater than 30 GHz. Having in mind the particular problems associated with microwave frequencies, the printed circuits of the millimeter circuits implement propagation lines. A propagation line is formed by a conducting line which interacts with a ground plane. The printed circuit represented in FIGS. 1 and 2 implements conducting lines of the microstrip type. In a microstrip, a conducting line is a conductor 6, having the form of a strip, situated on the upper face 2 of the dielectric substrate 1. The conductor 6 interacts with a ground plane 7 which may cover the entire lower face 3 of the dielectric substrate 1, producing an electric field between the conductor 6 and the ground plane 7. In accordance with the process according to the invention for bonding the first millimeter circuit, represented in FIGS. 1 and 2, to a second millimeter circuit, not represented, a first conducting line is selected on the first millimeter circuit, the conductor 6, during a first step.

Figure 3:
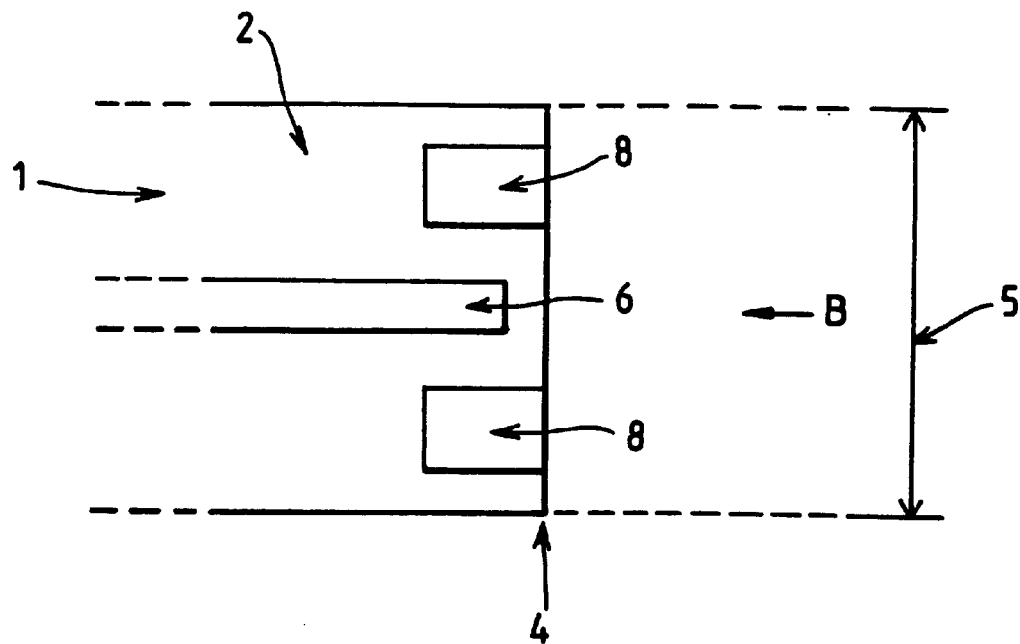
FIG. 3 is a block diagram of an end of a second millimeter element according to the present invention.
Figure 4:
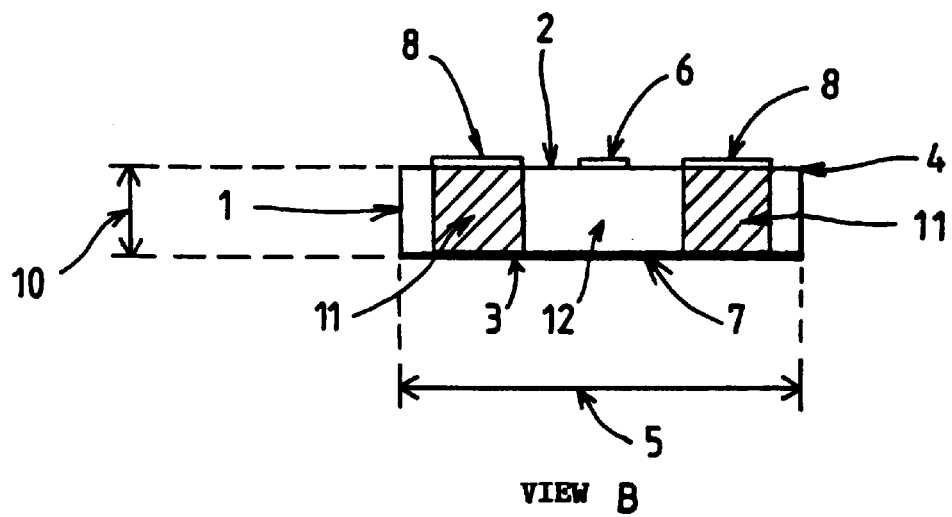
FIG. 4 is a sectional view of the millimeter element of FIG. 3.
Figure 5:
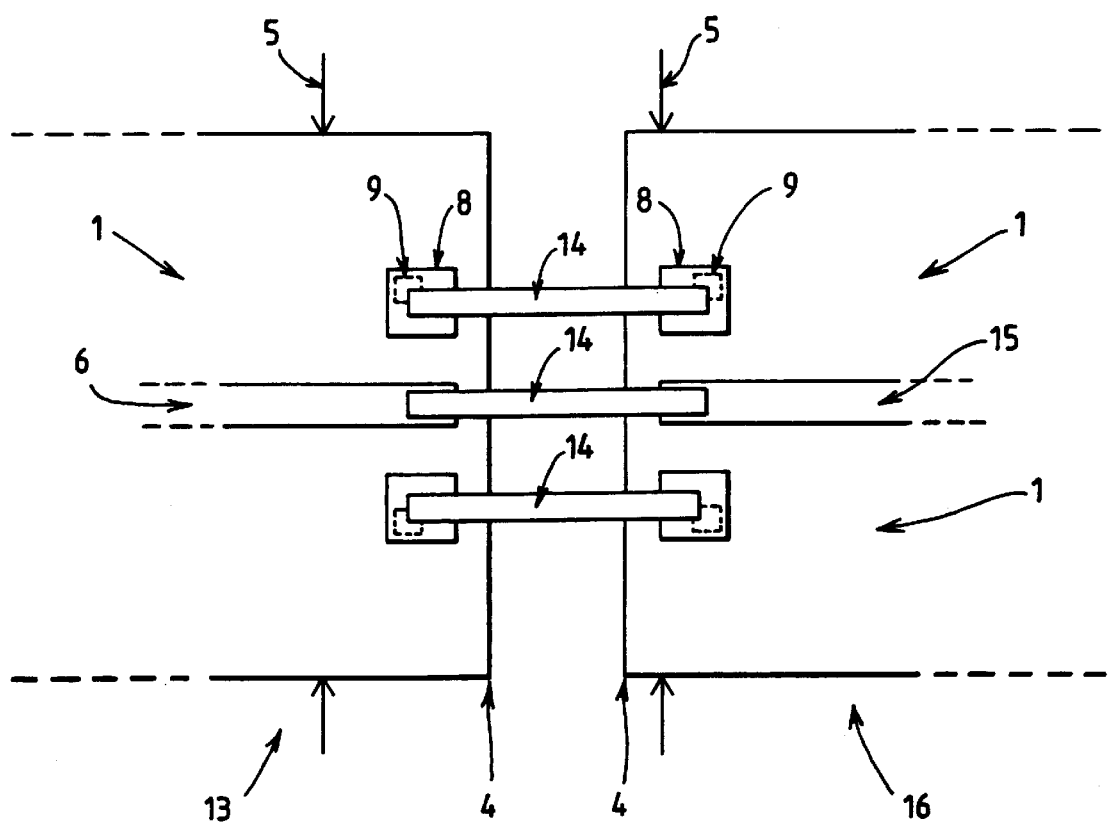
FIG. 5 is a block diagram of two millimeter circuits bonded in accordance with a process of the present invention.

The subsequent step consists in making at least two bonding zones 8 on the upper face 2 of the dielectric substrate 1 on either side of an end of the first conducting line selected, the conductor 6. These bonding zones 8 have the particular feature of being set to the potential of the ground plane 7. According to the example chosen and illustrated by FIGS. 1 and 2, the bonding zones 8 are set to the potential of the ground plane 7 by a metallized feedthrough 9 passing through the thickness 10 of the dielectric substrate 1. According to a variant of the process, the bonding zones 8 are set to the potential of the ground plane 7 by a metallization on a rim of the dielectric substrate 1. This variant is illustrated in FIGS. 3 and 4. FIG. 4 is a side view of FIG. 3, along the arrow B. The rim adopted is preferably the one situated beneath the edge 4. So as not to create any additional tip capacitance, the metallized parts 11 of the rim cover part of the rim situated plumb with the conductors 8. The bonding zones 8 are positioned along the edge 4 of the dielectric substrate 1 so that there is electrical continuity between the bonding zones 8 and the metallized parts 11 of the rim. The last step of the process is described with regard to FIG. 5.

The first conducting line 6, selected beforehand, belonging to a first millimeter circuit 13 is bonded according to a first embodiment, by means of gold wires 14, to a second conducting line 15 belonging to a second millimeter circuit 16. Each of the bonding zones 8, taken individually, of the first millimeter circuit 13 is bonded, by means of a gold wire 14, to one bonding zone 8 of the second millimeter circuit 16. In the example represented in FIG. 5, each millimeter circuit 13, 16 is equipped with two bonding zones 8, distributed along the edge 4 of the dielectric substrate 1. Bonding by gold wires, illustrated in FIG. 5, may not be possible when, for example, the two millimeter circuits to be bonded are too far apart.

According to a second embodiment, the bonds between the first and the second millimeter circuits are made by soldered wires. According to a third embodiment, the bonds between the first and the second millimeter circuits are made by a particular device known as to a "lead frame." This device consists of wires photoetched onto a small plate. During the process, the wires are soldered, for example, by electric soldering to the first millimeter circuit then they are soldered to the second millimeter circuit according to a technique, such as, wave soldering or vapor phase soldering.

Figure 6:
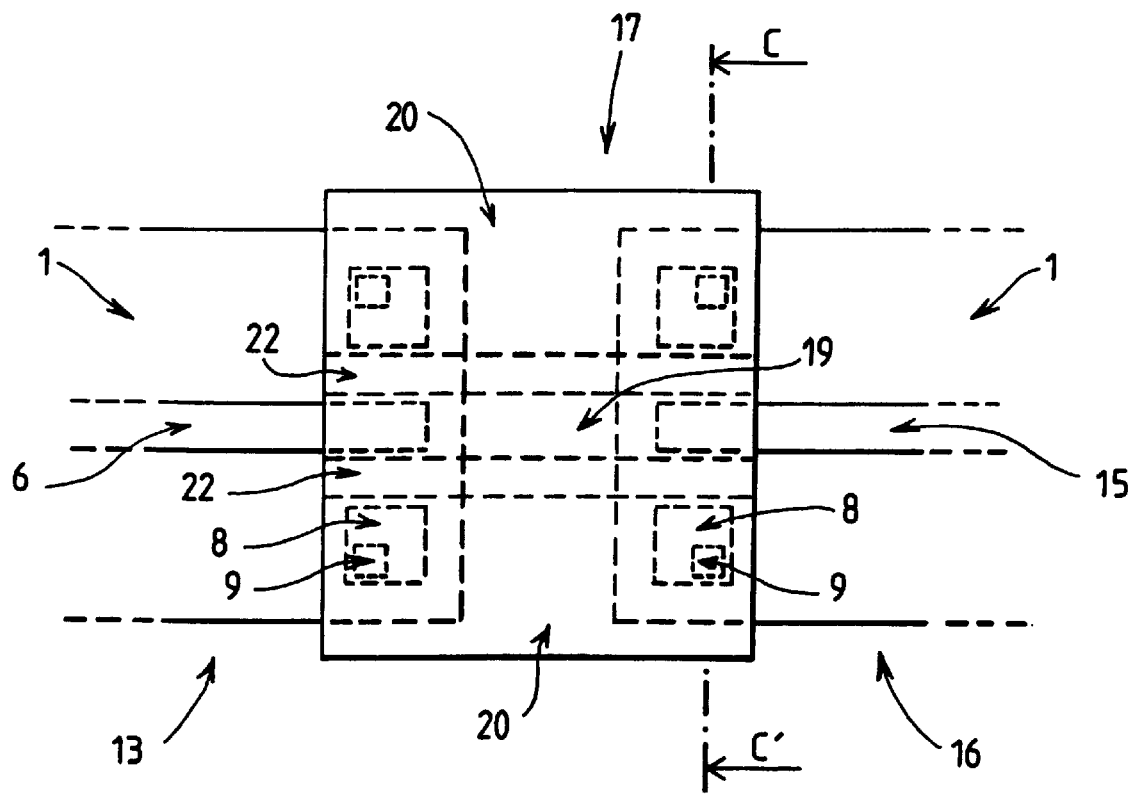
FIG. 6 is a block diagram of a device which bonds, according to a process of the present invention, a first millimeter element to a second millimeter element.
Figure 7:
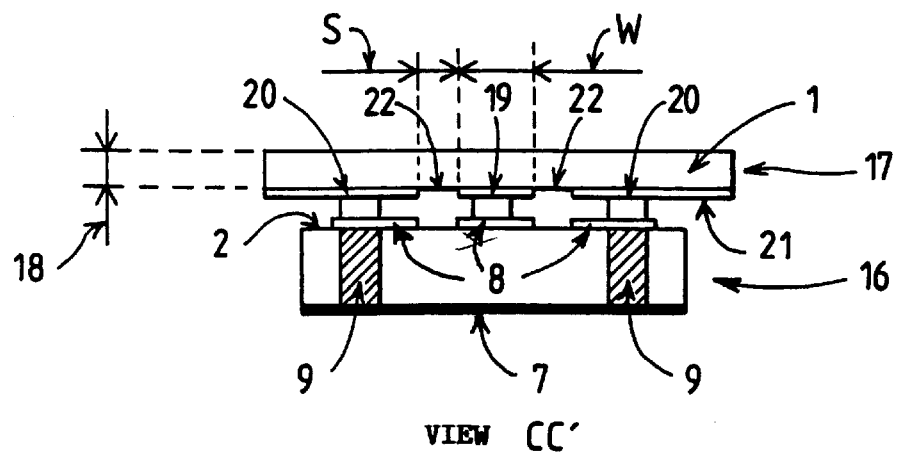
FIG. 7 is a sectional view of the assembly represented in FIG. 6.

A variant of the process, which improves the bonding ability, is illustrated by FIGS. 6 and 7. FIG. 7 is a sectional view through the axis CC' of the millimeter circuit represented in FIG. 6. According to this variant, the bond between two millimeter circuits 13 and 16 is made by a coplanar line 17. The coplanar line 17 is made on a substrate 1, of determined thickness 18 and having a high dielectric constant, such as an alumina. The coplanar line 17 is formed by a conducting line 19 of determined width W bordered by two ground planes 20 situated symmetrically on either side of the conducting line 19 on the same upper face 21 of the substrate. The conducting line 19 and the two ground planes 20 can be obtained by depositing thin photoetched layers. The conducting line 19 is separated from each of the two ground planes 20 by a non-metallized space 22 of determined width S. Preferably, the values of the width W of the conducting line 19, of the width S of the space 22 separating the conducting line 19 from the two ground planes 20 and of the dielectric constant of the substrate 1 are determined in such a way that the coplanar line 17 possesses a characteristic impedance identical to the characteristic impedance of the conducting lines 6 and 15 belonging to the millimeter circuits 13 and 16 to be bonded, for example, 50 ohms. The coplanar line 17 is arranged on the two millimeter circuits 13 and 16 to be bonded with the upper face 21 opposite the upper faces 2 of the two millimeter circuits 13 and 16. It is thereafter soldered, for example, using a wave soldering technique, such as the one used for soldering Surface Mounted Components (SMCS). On completing the soldering operation, electrical continuity of very good quality is ensured between the conducting lines 6 and 15 of the two millimeter circuits 13 and 16 and between the bonding zones 8 of the two millimeter circuits 13 and 16.

Figure 8:
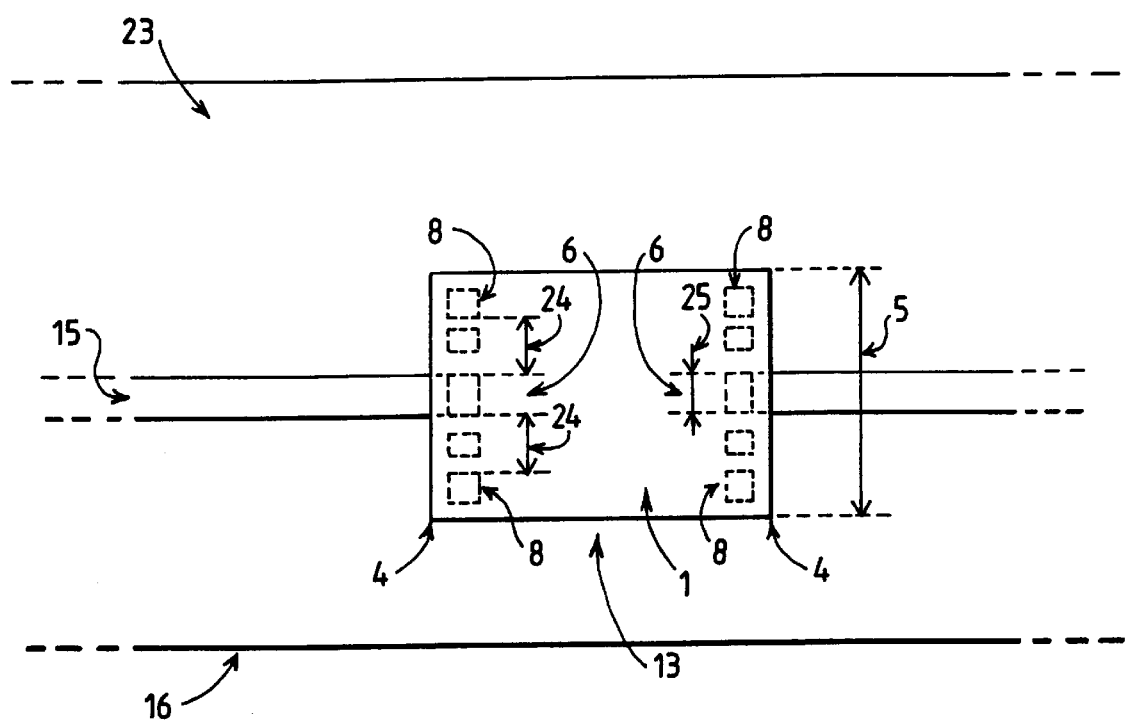
FIG. 8 is a block diagram of a millimeter element mounted in accordance with a surface-mounted components technique and bonded to a substrate according to a process of the present invention.

In certain configurations, especially those relating to surface mounting techniques, the ground planes of the millimeter elements to be bonded together may not be situated in the same geometrical plane. Under these conditions, the bonding of the millimeter elements is carried out in accordance with a particular embodiment of the process. In the case of a millimeter element transferred to a substrate, after selecting the conducting lines and making the bonding zones, the bonds between conducting lines and bonding zones are made directly by soldering, for example, using a wave soldering technique. In a preparation step of the process, a hole is made in the substrate so as to avoid any mechanical or electrical problem when transferring the millimeter element to the substrate. In these configurations and under certain conditions, defects in ground continuity may appear. They disturb the local electric field and worsen the performance of the millimeter element. A variant of the process makes it possible to remedy this problem. In accordance with the illustration given in FIG. 8, bonding zones 8 are distributed along the entire edge 4 of the dielectric substrate 1 of the millimeter element 13 attached, as well as opposite the transfer substrate 23. In particular, two additional bonding zones 8 are made at a large distance 24 from the conducting line 6. This distance 24 is such that the additional bonding zones 8 are situated in the corners of the dielectric substrate 1 of the millimeter element 13 attached when the width 5 of the dielectric substrate 1 lies between three times the width 25 of the conducting line 6 and one hundred times this same width 25.

The bonding process has been described essentially with regard to millimeter circuits implementing conducting lines of the microstrip type. It applies also to millimeter circuits implementing conducting lines of the coplanar type made on dielectric substrates. Under these conditions, the bonding zones are made directly on the ground planes arranged on one and the same face of the dielectric substrate. The potential of the bonding zones is thus by nature that of the potential of ground.

Figure 9:
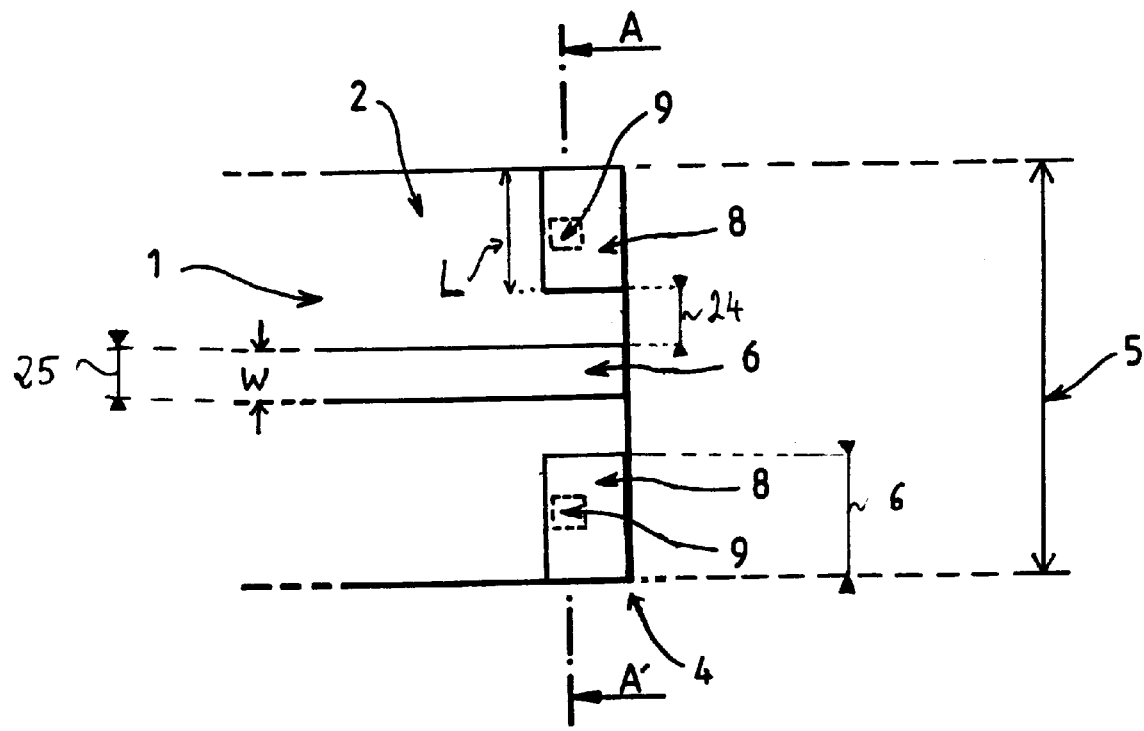
FIG. 9 is a block diagram of an end of another embodiment for the millimeter element of the present invention.
Figure 10:
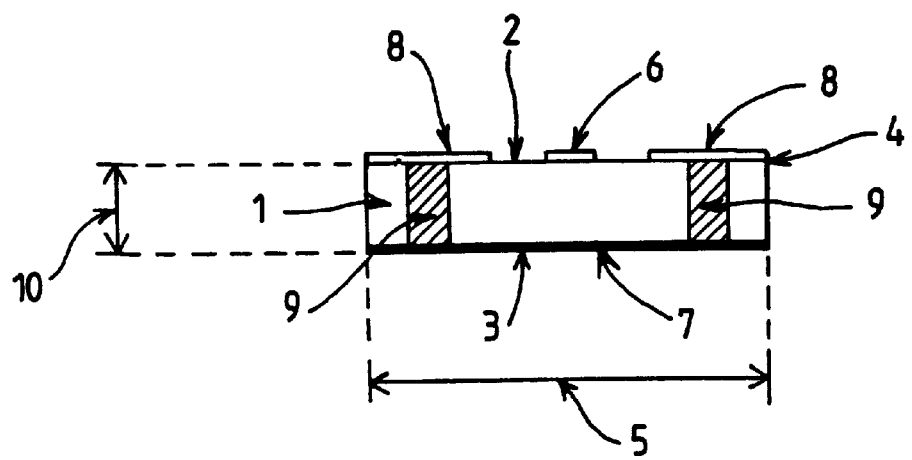
FIG. 10 is a sectional view of the millimeter element of FIG. 9.

In another embodiment of the invention, illustrated in FIGS. 9 and 10, the bonding zones 8 can be distributed along the edge 4 of each of the millimeter elements. The inventors of the present inventions have discovered that the electromagnetic field, generated by the signal in the strip lines, spreads relatively far away from the strip lines. In particular, the inventors have determined that it is advantageous to use relatively long continuous bonding zones along the edge of the millimeter elements so as to achieve electrical continuity all along the zone impacted by the electromagnetic field in order for the ground path to continuously cover the whole area covered by the fields. The inventors have observed that under certain circumstances, non-continuous bounding zones may lead to a problematic resonance in the millimeter elements.

Preferably, the continuous bounding zones 8 are as close as possible to the conducting line 6. However, it is preferable that the bounding zones 8 are at a distance 24 from the conducting line 6, e.g., not closer than the width W (labeled 25 in FIG. 9) of the conducting line 6, otherwise the close proximity could disturb the signal propagation. The inventors have also discovered that it is preferable that the bounding zones 8 have a length L (labeled 26 in FIG. 9) of at least about two times the width W of the conducting line 6. For example, the length of bounding zones 8 can be two, three, four, five times, or more, the width of the conducting line. In FIG. 9, the continuous bounding zones 8 extend to the lateral edges of the substrate, although this is a preferred embodiment, a substantially equivalent result may be obtained if the continuous bounding zones 8 do not reach the edges.

In this embodiment, the bounding zones 8 may be connected to the ground plane via the rim 11 as shown in FIG. 4. Furthermore, a number of connection mechanisms can be used between millimeter elements for this embodiment, including the ones described above, i.e., gold wire connections, solder wire connections, lead frames and coplanar lines can be used.

The above embodiment, featuring continuous bounding zones along the edge of the substrate, may also be used with coplanar conducting lines, so that the bounding zones are connected to ground planes on the same face on which the conducting line is formed.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A microstrip element comprising:
   a substrate having an upper face and a lower face;
   a conducting line on said upper face and oriented substantially perpendicular to an edge of said substrate;
   a ground plane on said lower face of said substrate; and
   two continuous bonding zones on said upper face and along said edge of said substrate, each continuous bonding zone being electrically grounded to said ground plane, and having a length along said edge of at least about two times the width of said conducting line.

2. A microstrip element, comprising:
   a substrate having an upper face and a lower face;
   a conducting line on said upper face and oriented substantially perpendicular to an edge of said substrate;
   a ground plane on said lower face of said substrate;
   two continuous bonding zones on said upper face and along said edge of said substrate, each continuous bonding zone being electrically grounded to said ground plane, and having a length along said edge of at least about two times the width of said conducting line; and
   an electrically conducting rim configured to connect said continuous bonding zones and said ground plane.

3. The microstrip element of claim 2, wherein said bonding zones have a length along said edge between about two and about five times the width of the conducting line.

4. The microstrip element of claim 3, wherein each of said bonding zones extends to lateral edges of said substrate.

5. The microstrip element of claim 2, wherein said rim is positioned on said edge of said substrate.

6. The microstrip element of claim 5, wherein said rim has a width along said edge equal to said length of said continuous bonding zones.

7. A circuit board comprising:
   a first microstrip element and a second microstrip element connected to each other, each microstrip element comprising:
      a substrate having an upper face and a lower face,
      a conducting line on said upper face and oriented substantially perpendicular to an edge of said substrate,
      a ground plane on said lower face of said substrate, and
      two continuous bonding zones on said upper face and along said edge of said substrate, each continuous bonding zone being electrically grounded to said ground plane, and having a length along said edge of at least about two times the width of said conductive line, wherein
      the conducting line of the first microstrip element is connected to the conducting line of the second microstrip element, and
      the continuous bonding zones of the first microstrip element are connected to the continuous bonding zones of the second microstrip element.

8. A circuit board comprising:
   a first microstrip element and a second microstrip element connected to each other, each microstrip element comprising:
      a substrate having an upper face and a lower face,
      a conducting line on said upper face and oriented substantially perpendicular to an edge of said substrate,
      a ground plane on said lower face of said substrate, two continuous bonding zones on said upper face and along said edge of said substrate, each continuous bonding zone being electrically grounded to said ground plane, and having a length along said edge of at least about two times the width of said conductive line; and an electrically conducting rim configured to connect the continuous bonding zones to the ground plane of the respective microstrip elements, wherein the conducting line of the first microstrip element is connected to the conducting line of the second microstrip element, and the continuous bonding zones of the first microstrip element are connected to the continuous bonding zones of the second microstrip element.

9. The circuit board of claim 8, wherein said continuous bonding zones of each microstrip element have a length along said edge between about two and about five times the width of the conducting lines.

10. The circuit board of claim 9, wherein each of said bonding, zones of each microstrip element extends to lateral edges of said substrate.

11. The circuit board of claim 9, further comprising gold wires configured to connect said first and second microstrip elements.

12. The circuit board of claim 9, further comprising soldered wires configured to connect said first and second microstrip elements.

13. The circuit board of claim 9, further comprising a lead frame configured to connect said first and second microstrip elements.

14. The circuit board of claim 9, further comprising a coplanar line configured to connect said first and second microstrip elements.

15. The microstrip element of claim 8, wherein said rim is positioned on said edge of said substrate.

16. The microstrip element of claim 15, wherein said rim has a width along said edge equal to said length of said continuous bonding zones.

17. A method of bonding a first microstrip element having a first substrate, to a second microstrip element, having a second substrate, comprising:

forming a first conducting line on an upper face of the first substrate and perpendicular to an edge of said first substrate;

forming a second conducting line on an upper face of the second substrate and perpendicular to an edge of said second substrate;

forming a first ground plane on a lower face of said first substrate;

forming a second ground plane on a lower face of said second substrate;

forming two continuous bonding zones on said upper face of said first microstrip element and along said edge of said first substrate, each continuous bonding zone being electrically grounded, and having a length along said edge of at least about two times the width of said conductive line formed on the first substrate;

forming two continuous bonding zones on said upper face of said second microstrip element and along said edge of said second substrate, each continuous bonding zones being electrically grounded, and having a length along said edge of at least about two times the width of said conductive line formed on the second substrate;

connecting the conducting line of the first microstrip element to the conducting line of the second microstrip element; and connecting the continuous bonding zones of the first microstrip element to the continuous bonding zones of the second microstrip element.

18. A method of bonding a first microstrip element having a first substrate, to a second microstrip element, having a second substrate, comprising:

forming a first conducting line on an upper face of the first substrate and perpendicular to an edge of said first substrate;

forming a second conducting line on an upper face of the second substrate and perpendicular to an edge of said second substrate;

forming a first ground plane on a lower face of said first substrate;

forming a second ground plane on a lower face of said second substrate;

forming two continuous bonding zones on said upper face of said first microstrip element and along said edge of said first substrate, each continuous bonding zone being electrically grounded, and having a length along said edge of at least about two times the width of said conductive line formed on the first substrate;

forming two continuous bonding zones on said upper face of said second microstrip element and along said edge of said second substrate, each continuous bonding zones being electrically grounded, and having a length along said edge of at least about two times the width of said conductive line formed on the second substrate;

connecting the conducting line of the first microstrip element to the conducting line of the second microstrip element;

connecting the continuous bonding zones of the first microstrip element to the continuous bonding zones of the second microstrip element;

connecting the continuous bonding zones of the first microstrip element to the first ground plane of the first microstrip element with a first electrically conducting rim; and connecting the continuous bonding zones of the second microstrip element to the second ground plane of the second microstrip element with a second electrically conducting rim.

19. The method of claim 18, wherein forming said continuous bonding zones of each microstrip element is performed so that said continuous bonding zones of each microstrip element have a length along said edge between about two and about five times the width of the conducting lines.

20. The method of claim 19, wherein forming said continuous bonding zones of each microstrip element is performed so that said continuous bonding zones of each microstrip element extend to lateral edges of said substrate.

21. The method of claim 18, wherein connecting the conducting lines comprises wave soldering.

22. The method of claim 18, wherein connecting the conducting lines comprises electric soldering.

23. The method of claim 18, wherein connecting the conducting lines comprises vapor phase soldering.

24. The method of claim 18, wherein said first and second rims are positioned on said edge of said first and second substrates respectively.

25. The method of claim 24, wherein:

said first rim has a width equal to said length of each of said continuous bonding zones on said first microstrip element, and said second rim has a width equal to said length of each of said continuous bonding zones on said second microstrip element.

26. A microstrip element comprising:
   a substrate having an upper face and a lower face;
   a conducting line on said upper face and oriented substantially perpendicular to an edge of said substrate;
   a ground plane on said lower face of said substrate; and
   two continuous bonding zones on said upper face and along said edge of said substrate, each continuous bonding zone being electrically grounded to said ground plane, and having a length along said edge of at least about two times the width of said conducting line,
   wherein said two continuous bonding zones are connected to said ground plane via feed-throughs passing through a thickness of said substrate, on which said two continuous bonding zones are located.

27. The microstrip element of claim 26, wherein said bonding zones have a length along said edge between about two and about five times the width of the conducting line.

28. The microstrip element of claim 27, wherein each of said bonding zones extends to lateral edges of said substrate.

29. A circuit board comprising:
   a first microstrip element and a second microstrip element connected to each other, each microstrip element comprising:
      a substrate having an upper face and a lower face,
      a conducting line on said upper face and oriented substantially perpendicular to an edge of said substrate,
      a ground plane on said lower face of said substrate, and
      two continuous bonding zones on said upper face and along said edge of said substrate, each continuous bonding zone being electrically grounded to said ground plane, and having a length along said edge of at least about two times the width of said conductive line,
   wherein the conducting line of the first microstrip element is connected to the conducting line of the second microstrip element,
   wherein the continuous bonding zones of the first microstrip element are connected to the continuous bonding zones of the second microstrip element, and
   wherein, for each of said first and second microstrip elements, said two continuous bonding zones are connected to said ground plane via feed-throughs passing through a thickness of said substrate, on which said two continuous bonding zones are located.

30. The microstrip element of claim 29, wherein said bonding zones have a length along said edge between about two and about five times the width of the conducting line.

31. The microstrip element of claim 30, wherein each of said bonding zones extends to lateral edges of said substrate.

32. A method of bonding a first microstrip element having a first substrate, to a second microstrip element, having a second substrate, comprising:
   forming a first conducting line on an upper face of the first substrate and perpendicular to an edge of said first substrate;
   forming a second conducting line on an upper face of the second substrate and perpendicular to an edge of said second substrate;
   forming a first ground plane on a lower face of said first substrate;
   forming a second ground plane on a lower face of said second substrate;
   forming two continuous bonding zones on said upper face of said first microstrip element and along said edge of said first substrate, each continuous bonding zone being electrically grounded, and having a length along said edge of at least about two times the width of said conductive line formed on the first substrate;
   forming two continuous bonding zones on said upper face of said second microstrip element and along said edge of said second substrate, each continuous bonding zones being electrically grounded, and having a length along said edge of at least about two times the width of said conductive line formed on the second substrate;
   connecting the conducting line of the first microstrip element to the conducting line of the second microstrip element;
   connecting the continuous bonding zones of the first microstrip element to the continuous bonding zones of the second microstrip element;
   grounding said two continuous bonding zones of said first microstrip element to said first ground plane via feed-throughs passing through a thickness of said first substrate; and
   grounding said two continuous bonding zones of said second microstrip element to said second ground plane via feed-throughs passing through a thickness of said second substrate.

33. The method of claim 32, wherein forming said continuous bonding zones of each microstrip element is performed so that said continuous bonding zones of each microstrip element have a length along said edge between about two and about five times the width of the conducting lines.

34. The method of claim 33, wherein forming said continuous bonding zones of each microstrip element is performed so that said continuous bonding zones of each microstrip element extend to lateral edges of said substrate.

* * * * *

UNITED STATES PATENT AND TRADEMARK OFFICE
CERTIFICATE OF CORRECTION

PATENT NO. : 6,529,105 B1
DATED : March 4, 2003
INVENTOR(S) : Cachier et al.

It is certified that error appears in the above-identified patent and that said Letters Patent is hereby corrected as shown below:

Title page,
Item [73] should read:
-- [73] Assignee: Thomson-CSF, Paris (FR) --

Signed and Sealed this

First Day of June, 2004

JON W. DUDAS
*Acting Director of the United States Patent and Trademark Office*